(12) United States Patent
Bard et al.

(10) Patent No.: US 7,073,139 B2
(45) Date of Patent: Jul. 4, 2006

(54) METHOD FOR DETERMINING CELL BODY AND BIASING PLATE CONTACT LOCATIONS FOR EMBEDDED DRAM IN SOI

(75) Inventors: Karen A. Bard, Hopewell Junction, NY (US); Herbert L. Ho, New Windsor, NY (US)

(73) Assignee: International Business Machines Corporation, Armonk, NY (US)

( * ) Notice: Subject to any disclaimer, the term of this patent is extended or adjusted under 35 U.S.C. 154(b) by 458 days.

(21) Appl. No.: 10/250,090

(22) Filed: Jun. 3, 2003

(65) Prior Publication Data
US 2004/0250221 A1  Dec. 9, 2004

(51) Int. Cl.
*G06F 17/50* (2006.01)

(52) U.S. Cl. .................... 716/1; 716/8; 716/11; 716/19

(58) Field of Classification Search .................... 716/1, 716/8–11, 19
See application file for complete search history.

(56) References Cited

U.S. PATENT DOCUMENTS

| | | | |
|---|---|---|---|
| 5,822,214 A * | 10/1998 | Rostoker et al. | ............... 716/10 |
| 5,907,170 A | 5/1999 | Forbes et al. | |
| 5,909,618 A | 6/1999 | Forbes et al. | |
| 5,914,511 A | 6/1999 | Noble et al. | |
| 6,177,708 B1 | 1/2001 | Kuang et al. | |
| 6,229,342 B1 | 5/2001 | Noble et al. | |
| 6,307,235 B1 | 10/2001 | Forbes et al. | |
| 6,350,653 B1 | 2/2002 | Adkisson et al. | |
| 6,429,477 B1 | 8/2002 | Mandelman et al. | |
| 6,437,405 B1 | 8/2002 | Kim | |
| 6,553,561 B1 * | 4/2003 | Bard et al. | .................... 716/19 |

* cited by examiner

*Primary Examiner*—Paul Dinh
(74) *Attorney, Agent, or Firm*—H. Daniel Schnurmann; Cantor Colburn LLP

(57) ABSTRACT

A method for determining contact location for embedded dynamic random access memory (eDRAM) formed in a silicon-on-insulator (SOI) substrate includes reviewing contact design data for an eDRAM device and discarding contact locations corresponding to contact shapes within a support area of the eDRAM device. Contact locations corresponding to bitline contacts to storage cells within the eDRAM device are saved and outputted to a custom design level to be used in forming body contacts for the eDRAM formed in the SOI substrate.

10 Claims, 3 Drawing Sheets

METHOD FOR DETERMINING CELL BODY AND BIASING PLATE CONTACT LOCATIONS FOR EMBEDDED DRAM IN SOI

BACKGROUND OF INVENTION

The present invention relates generally to semiconductor device processing and, more particularly, to a method for determining cell body and biasing plate contact location for embedded dynamic random access memory (eDRAM) in silicon-on-insulator (SOI) substrates.

Dynamic random access memory, or DRAM, is a type of semiconductor memory in which the information is stored as data bits in capacitors on a metal-oxide-semiconductor (MOS) integrated circuit. Each bit is typically stored as an amount of electrical charge in a storage cell consisting of a capacitor and a transistor. Due to charge leakage, the capacitor discharges gradually and the memory cell can lose the information. Therefore, to preserve the information, the memory must be refreshed periodically. Despite this inconvenience, the DRAM is a very popular memory technology because of its high density and consequent low price.

Conventional semiconductor DRAM devices are formed in bulk semiconductive substrate material by implanting a well of either p-type or n-type material in a wafer of either type material. Gates and source/drain diffusions are then manufactured using commonly known processes. These can form devices known as metal-oxide-semiconductor field effect transistors, or MOSFETs. When a given chip uses both p-type and n-type semiconductors, it is known as a complementary metal oxide semiconductor (CMOS) chip. Each of these type devices must be electrically isolated from the others in order to avoid electrical shorting of the circuits. A relatively large amount of surface area is needed for the electrical isolation of the various FETs, which is undesirable in the current trend toward overall size reduction and greater integration. Additionally, parasitic paths and junction capacitance problems may be present because of the physical proximity of the source/drain diffusions to other FETs and to the bulk substrate. These problems more frequently arise when trying to scale circuitry down to the sizes necessary for greater circuit density.

Silicon-on-insulator (SOI) technology is one approach that has been increasingly used to alleviate these problems. However, SOI devices may suffer from problems such as self-heating, electrostatic discharge susceptibility, low breakdown voltage, and dynamic floating body effects, which in turn present problems for passgate devices and devices requiring tight threshold voltage control. The so-called "floating body effect" occurs when the body of the device is not connected to a fixed potential and, therefore, the device takes on a charge based on the history of the device. The floating body effect greatly affects device reliability.

Certain types of semiconductor memory are more susceptible to the floating body effect. For instance, in dynamic random access memory (DRAM) the information is stored in capacitors in an MOS circuit. Thus, in DRAM, the floating body effect is especially detrimental since it is critical that the associated transistor stays in an "off" condition to prevent charge leakage from the storage capacitor. As such, it is generally advantageous to form a DRAM array in bulk silicon regions, and advantageous to form other logic devices in an SOI region. In the case of an embedded DRAM (eDRAM) device, such as is found in the area of Application Specific Integrated Circuit (ASIC) technologies for example, the memory array region of the device is generally formed in proximity to the support regions of the device. As result, eDRAM devices have recently been formed within a designed bulk/SOI hybrid substrate, wherein the DRAM devices are formed in the bulk regions of the hybrid substrate and the support devices are formed in the SOI regions of the hybrid substrate.

For such configurations, one existing approach has been to pattern and create both bulk and SOI regions on the same wafer by processes such as separation by implantation of oxygen (SIMOX), for example. However, the additional lithography, patterning and implantation steps associated therewith increase the overall manufacturing costs of the device. Accordingly, it would be desirable to be able to form both support and area areas of an eDRAM device on a uniform substrate (such as an SOI substrate), while still retaining the benefits of a hybrid substrate in terms of device performance.

SUMMARY OF INVENTION

The foregoing discussed drawbacks and deficiencies of the prior art are overcome or alleviated by a method for determining contact location for embedded dynamic random access memory (eDRAM) formed in a silicon-on-insulator (SOI) substrate. In an exemplary embodiment, the method includes reviewing contact design data for an eDRAM device and discarding contact locations corresponding to contact shapes within a support area of the eDRAM device. Contact locations corresponding to bitline contacts to storage cells within the eDRAM device are saved and outputted to a custom design level to be used in forming body contacts for the eDRAM formed in the SOI substrate.

In another aspect, a method for determining body contact location and biasing plate contact location for embedded dynamic random access memory (eDRAM) formed in a silicon-on-insulator (SOI) substrate includes reviewing contact design data for a bulk eDRAM device. Contact locations corresponding to contact shapes within a support area of the eDRAM device are discarded. Contact locations corresponding to bitline contacts to storage cells within the bulk eDRAM device, contact locations corresponding to eDRAM p-well contacts within the bulk eDRAM device, and contact locations corresponding to eDRAM n-band contacts within the bulk eDRAM device are saved. The saved contact locations are used to design a mask for creating body contacts and biasing plate contacts for the eDRAM formed in the SOI substrate.

In still another aspect, a method for forming an embedded dynamic random access memory (eDRAM) in a silicon-on-insulator (SOI) substrate includes defining a plurality of eDRAM storage cells on the SOI substrate. Body contact openings are defined in the SOI substrate through a designed mask and the body contact openings are filled with a body contact material. A plurality of eDRAM cell bitline contacts is formed to a first level of metallization, wherein the location of said body contact openings corresponds to the location of said bitline contacts.

BRIEF DESCRIPTION OF DRAWINGS

Referring to the exemplary drawings wherein like elements are numbered alike in the several Figures.

DETAILED DESCRIPTION

Disclosed herein is a method for determining cell body and biasing plate contact location for embedded dynamic random access memory (eDRAM) in silicon-on-insulator (SOI) substrates. Briefly stated, the method utilizes an algorithm developed to allow body contacts to be designed and incorporated into the cells (as well as the periphery) of an eDRAM array using existing eDRAM bulk design data and real estate. In particular, the algorithm analyzes the shape and location of each contact in the bulk eDRAM design data from the first level of metallization to silicon or polysilicon. Within the vast number of total contacts at this level, those existing contacts that do not define suitable locations for SOI body contacts (e.g., contacts in the support areas of the device) are automatically filtered out. Moreover, those existing contacts that do define suitable locations for SOI body contacts (e.g., bitline to eDRAM cell contacts, periphery p-well contacts or n-band contacts) are affirmatively selected to define a new mask to be used in forming the body contacts. Thereby, the algorithm allows for the conversion of a bulk CMOS based eDRAM design into an SOI based eDRAM design without the use of additional design resources or paying an area penalty in design.

Figure 1:
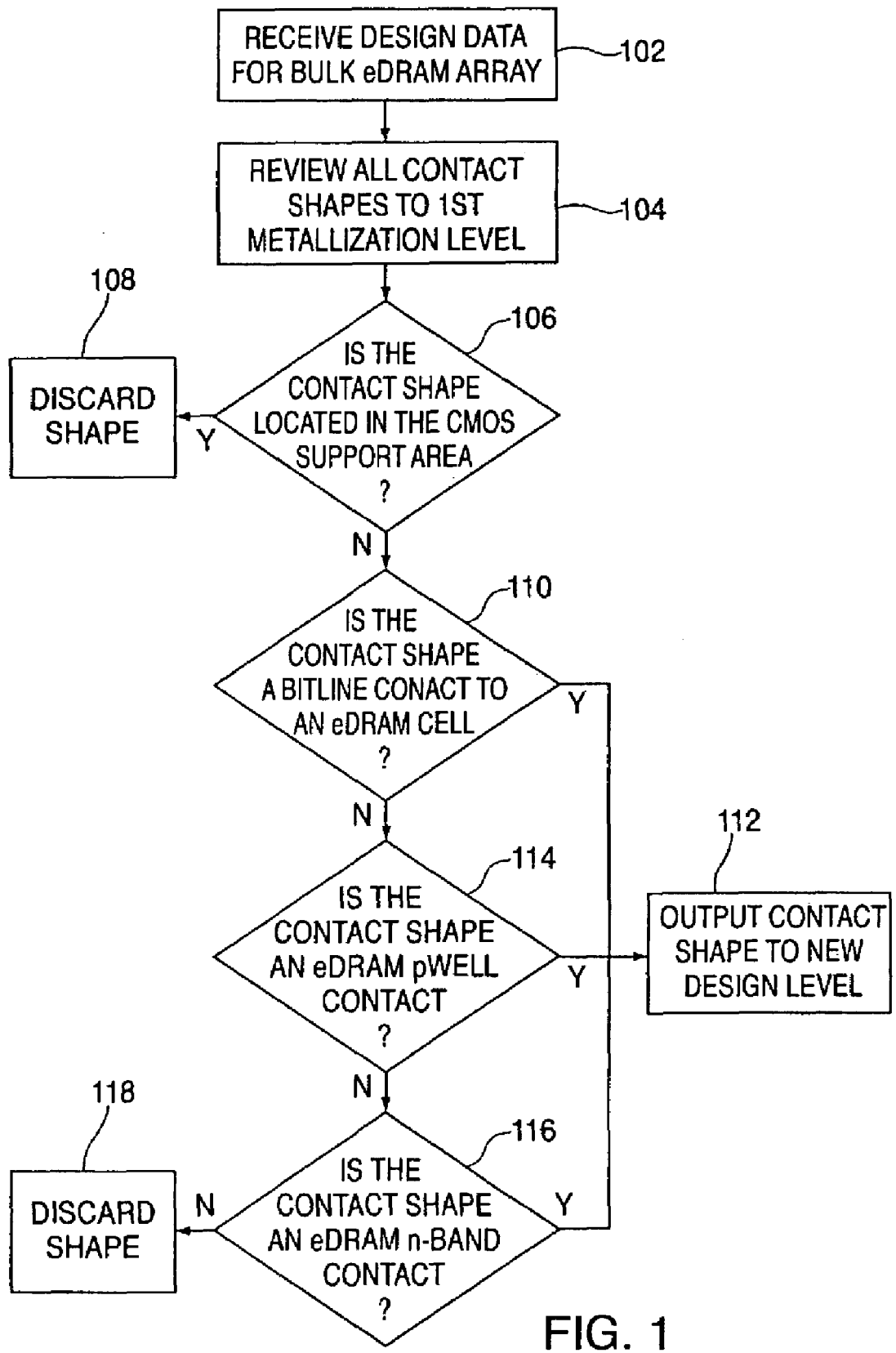
FIG. 1 is a flow diagram of an algorithm 100 illustrating a method for determining cell body and biasing plate contact location for eDRAM in SOI substrates, in accordance with an embodiment of the invention.

Referring initially to FIG. 1, there is shown a flow diagram of an algorithm 100 illustrating a method for determining cell body and biasing plate contact location for eDRAM in SOI substrates, in accordance with an embodiment of the invention. The method begins at block 102 by receiving the design data for a non-SOI eDRAM array (i.e., the design data for an eDRAM array formed on a bulk silicon region. As shown in block 104, each of the contacts from the first metallization level to silicon or polysilicon is collected from this design data and examined to see whether the location of that contact defines a suitable location for a cell body contact or a biasing plate contact. The general approach of algorithm 100 is to first filter out those contacts lying outside of the array area and to affirmatively select appropriate contacts within the array area or in the periphery of the array area for biasing.

Accordingly, as shown at decision block 106, it is first determined whether the contact shape is such that the contact is located within the CMOS support circuitry area of the eDRAM device. Examples of such contacts include CMOS source/drain diffusion contacts, CMOS gate contacts, bulk substrate contacts, bulk n-well contacts and metal to polysilicon wiring contacts. The determination of whether the contact is within the support area is based upon the shape of the contact, as well as the specific area(s) of interaction of the shape in the device. Thus, if it is determined that the contact shape is located in the support area, the shape is discarded (i.e., eliminated as a body contact location), as shown in block 108.

On the other hand, if the contact shape is not located within the CMOS support area, the algorithm proceeds to decision block 110 to determine whether the contact shape is a bitline contact to an eDRAM cell. If this is the case, this contact shape is outputted to a new design level where a customized mask including the selected contact shapes is created. This is reflected at block 112. In the particular case of a bitline contact to an eDRAM cell, the location thereof will be used to create the SOI body contact for that specific cell. However, if the contact shape does not correspond to an eDRAM cell bitline contact, then the algorithm proceeds to decision block 114. At this point, it is then determined whether the contact shape is an eDRAM p-well contact. Any such contact shape locations are also saved and outputted to the new design level (block 112), since these locations will correspond to p-well biasing plate contacts.

Finally, if the non-CMOS support contact is neither an eDRAM bitline contact nor an eDRAM p-well contact, the algorithm will then check to see whether it is an eDRAM n-band contact. If so, this contact shape is also saved and outputted to the new design level, as shown at block 112. Any contact not fitting one of the categories described in either block 110, 114 or 116 is thus discarded, as shown in block 118. Once each of the contacts beneath the M1 design level have been analyzed, a subset of such contacts (and their corresponding locations) will be included in a special mask to be used for defining the SOI body/biasing plate contacts during the other device processing sequences.

FIGS. 2 through 6 illustrate an exemplary processing sequence in which the mask generated by the above algorithm is used to create the SOI body/biasing plate contacts for an SOI eDRAM device 200 formed on an unpatterned SOI wafer. It will be noted that the figures designated by the suffix (a) represent an exemplary portion of the eDRAM storage cell area of the device 200, while the figures designated by the suffix (b) represent an exemplary portion of the periphery of the array wherein well biasing plate contacts are formed.

Figure 2A:
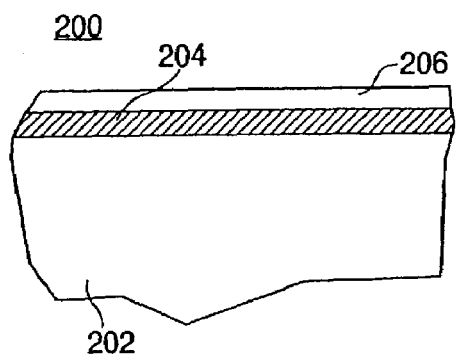
FIGS. 2 through 6 illustrate an exemplary processing sequence in which the mask generated by the algorithm of FIG. 1 is used to create the SOI body/biasing plate contacts for an SOI eDRAM device formed on an unpatterned SOI wafer, in accordance with a further aspect of the present invention.
Figure 2B:
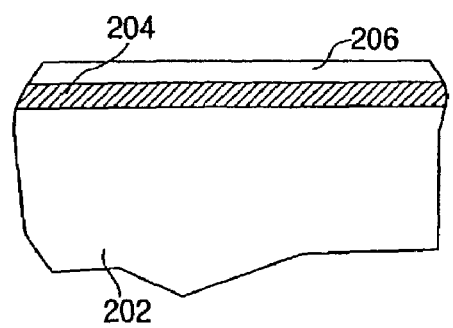

As shown in FIG. 2, the SOI wafer includes a bulk silicon region 202, a buried oxide (BOX) layer 204, and a silicon on insulator (SOI) layer 206. The SOI wafer may be manufactured in a number of ways known to those skilled in the art, including for example: silicon implanted with oxide (SIMOX), in which a bulk wafer is implanted with a large dose of oxygen at a high energy; bond-and-etch-back (BE-SOI), in which two bulk wafers have an oxide grown on a surface and a dopant profile is incorporated in one of the wafers to act as a marker layer, and wherein the two oxide surfaces are bonded together and one of the wafers is etched back to the marker dopant layer; and a method referred to as "smart cut", in which one of the wafers is hydrogen implanted before the first wafer is bonded to the second wafer, and wherein following the bonding of the two wafers, the excess silicon of one of the two wafers is cracked off using the implanted hydrogen to cause the cracking at the desired level.

Figure 3A:
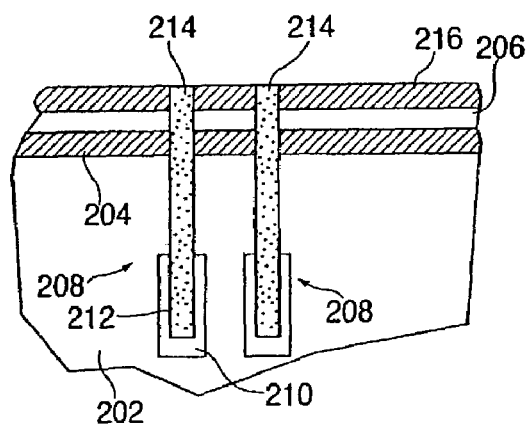
Figure 3B:
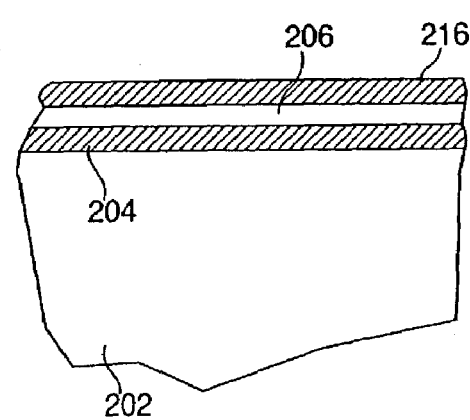

Regardless of the manner used to form the SOI wafer, FIG. 3(a) illustrates the formation of the eDRAM storage trench capacitors 208, including the buried plate 210, node dielectric 212 and N+ polysilicon fill 214 that is planarized down to a pad nitride 216 (e.g., silicon nitride). At this point during processing of a conventionally formed eDRAM device, the recess steps in forming the top portion of the cell buried strap would normally be performed. However, this step is bypassed until the cell body contacts are formed.

Figure 4A:
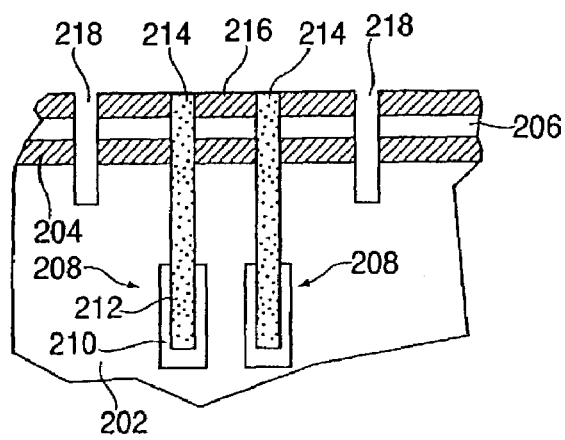
Figure 4B:
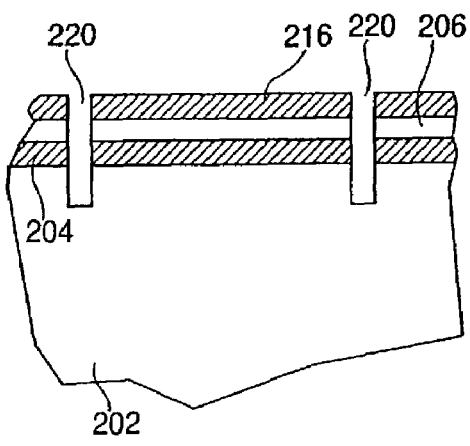
Figure 5A:
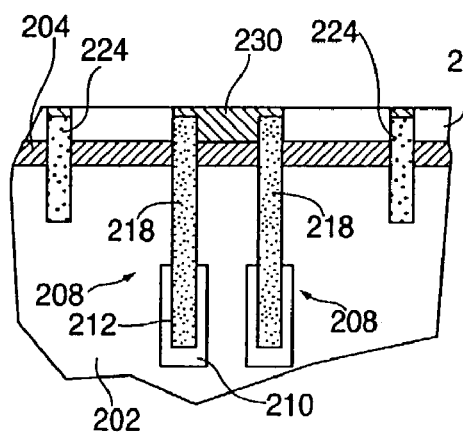
Figure 5B:
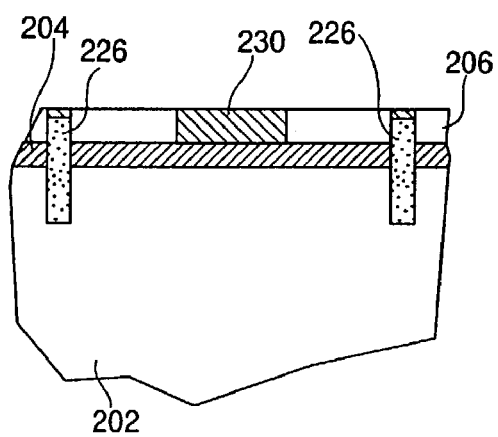

Once the N+ polysilicon fill 214 has been planarized down to the pad nitride 216, the cell body contact vias 218 and biasing plate contact vias 220 are lithographically defined (using the mask generated through algorithm 100) and etched in both the eDRAM array area and in the peripheral areas as shown in FIGS. 4(a) and 4(b), respectively. In the peripheral regions, the contacts are used to externally bias the array pass transistor and the buried plate of the capacitors. After etching of the vias 218, 220 through the SOI layer 206 and BOX layer 204, the pad nitride 216 is removed and the vias 218, 220 are thereafter filled with intrinsic polysilicon to form SOI body contacts 224 and biasing plate contacts 226, as shown in FIGS. 5(a) and 5 (b), respectively. In addition, the N+ polysilicon fill 214 (and intrinsic polysilicon 222) are recessed to form the top portion of a buried strap 228 of the storage cell in the array area, as particularly shown in FIG. 5(a). Shallow trench isolation (STI) areas 230 are also shown in FIGS. 5(a) and 5(b).

Figure 6A:
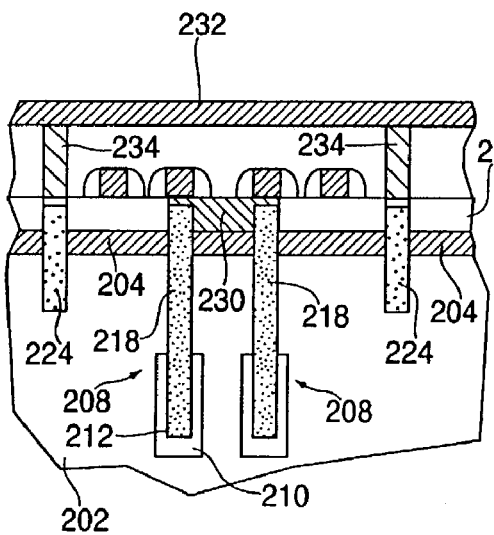
Figure 6B:
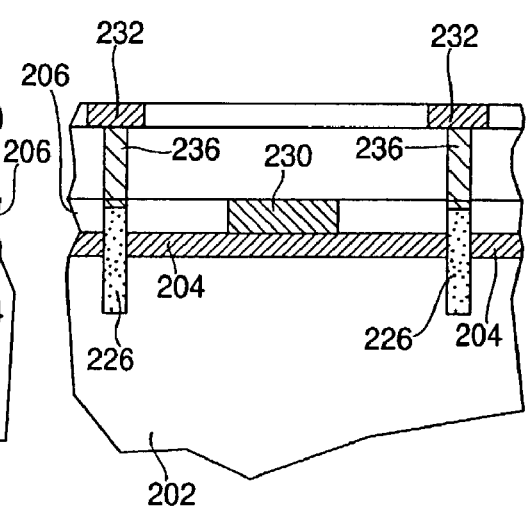

Finally, FIGS. 6(a) and 6(b) illustrate the processing steps up to the first layer of metallization 232. As will be noted from FIG. 6(a), the bitline contacts 234 in the array portion of the device are in alignment with the SOI body contacts 224, while in FIG. 6(b), the p-well contacts (or n-band contacts) 236 in the periphery are in alignment with the biasing plate contacts 226. In order to provide the proper migration of excess holes from the array, the cell body contacts 224 should be p-type silicon. P-type doping of the cell body contact intrinsic polysilicon is naturally performed during the array p-well doping process. The array p-well doping process also is extended to the array periphery so that the array passgate may be externally biased through the contacts placed at the peripheral diffusion areas. Furthermore, in order to properly bias the buried plate 210 of the trench capacitors, the peripheral diffusion contacts 226 should be n-type silicon. This doping may be accomplished through a conventional logic n-well mask.

As will be appreciated from the above description, the difficulty in using SOI wafers for forming eDRAM devices (i.e., the effect of the floating body on array pass transistors) is efficiently overcome. The use of the above described contact filtering algorithm results in the generation of an additional mask for creating the body contact/biasing plate vias. The body contact/biasing plate contact formation process is then integrated into the standard trench process, utilizing an additional deep ultraviolet (DUV) mask, a reactive ion etch (RIE) to a depth below the buried oxide, a polysilicon or epitaxial filling process, and a silicon planarization step. A principal advantage of the present invention embodiments lies in the fact that no patterning of an SOI wafer (such that both bulk and SOI regions coexist on the same wafer) is needed. Instead, the eDRAM is intentionally built on an SOI wafer. By building the eDRAM in unpatterned SOI wafers, it is thus possible to use bonded SOI wafers as well as SIMOX wafers.

In addition, by using the BOX, the process time in fabricating capacitors in SOI eDRAM may be greatly reduced as a number of processes (such as a collar oxide and an N+ polysilicon fill) could be eliminated. Still another advantage is that the body contacts do not require additional "chip real estate" since the contacts are created directly below the bitline contacts of the eDRAM cell. These contacts could therefore also be used for other circuits on a chip to regulate floating body effects.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method for determining contact location for embedded dynamic random access memory (eDRAM) formed in a silicon-on-insulator (SOI) substrate, the method comprising:
   reviewing contact design data for an eDRAM device;
   discarding contact locations corresponding to contact shapes within a support area of said eDRAM device;
   saving contact locations corresponding to bitline contacts to storage cells within said eDRAM device; and
   outputting said saved contact locations to a custom design level to be used in forming body contacts for the eDRAM formed in the SOI substrate.

2. The method of claim 1, further comprising saving contact locations corresponding to eDRAM p-well contacts within said eDRAM device.

3. The method of claim 2, further comprising saving contact locations corresponding to eDRAM n-band contacts within said eDRAM device.

4. The method of claim 3, further comprising discarding contact locations not corresponding to one of said bitline contacts, said p-well contacts and said n-band contacts.

5. The method of claim 1, wherein said reviewed contact data comprises contacts up to a first level of metallization in said eDRAM device.

6. The method of claim 1, wherein said contact locations corresponding to contact shapes within a support area of said eDRAM device further comprise at least one of: CMOS source/drain diffusion contacts, CMOS gate contacts, bulk substrate contacts, bulk n-well contacts and metal to polysilicon wiring contacts.

7. A method for determining body contact location and biasing plate contact location for embedded dynamic random access memory (eDRAM) formed in a silicon-on-insulator (SOI) substrate, the method comprising:
   reviewing contact design data for a bulk eDRAM device;
   discarding contact locations corresponding to contact shapes within a support area of said eDRAM device;
   saving contact locations corresponding to bitline contacts to storage cells within said bulk eDRAM device;
   saving contact locations corresponding to eDRAM p-well contacts within said bulk eDRAM device;
   saving contact locations corresponding to eDRAM n-band contacts within said bulk eDRAM device; and
   using said saved contact locations to design a mask for creating body contacts and biasing plate contacts for the eDRAM formed in the SOI substrate.

8. The method of claim 7, further comprising discarding contact locations not corresponding to one of said bitline contacts, said p-well contacts and said n-band contacts.

9. The method of claim 7, wherein said reviewed contact data comprises contacts up to a first level of metallization in said bulk eDRAM device.

10. The method of claim 7, wherein said contact locations corresponding to contact shapes within a support area of said bulk eDRAM device further comprise at least one of: CMOS source/drain diffusion contacts, CMOS gate contacts, bulk substrate contacts, bulk n-well contacts and metal to polysilicon wiring contacts.

* * * * *